United States Patent [19]
Childs

[11] Patent Number: 5,172,068
[45] Date of Patent: Dec. 15, 1992

[54] THIRD-ORDER PREDISTORTION LINEARIZATION CIRCUIT

[75] Inventor: Richard B. Childs, Harvard, Mass.

[73] Assignee: Amoco Corporation, Chicago, Ill.

[21] Appl. No.: 704,912

[22] Filed: May 21, 1991

Related U.S. Application Data

[63] Continuation of Ser. No. 583,890, Sep. 17, 1990, abandoned.

[51] Int. Cl.$^5$ .......................... G06G 7/10; G06G 7/24
[52] U.S. Cl. ................................... 328/162; 307/491; 307/492; 307/268; 330/149
[58] Field of Search ............... 307/491, 493, 520, 521, 307/523, 268, 492; 328/162, 163, 165, 167; 332/107; 330/149

[56] References Cited

U.S. PATENT DOCUMENTS

| | | | |
|---|---|---|---|
| 4,600,847 | 7/1986 | Baum | 307/491 |
| 4,752,743 | 6/1988 | Pham et al. | 330/149 |
| 4,943,783 | 6/1990 | Nojima | 330/149 |
| 4,987,378 | 1/1991 | Eggleston et al. | 330/149 |
| 4,992,754 | 2/1991 | Blauvelt et al. | 330/149 |

OTHER PUBLICATIONS

H. K. V. Lotsch, "Theory of Nonlinear Distortion Produced in a Semiconductor Diode," IEEE Trans. of Elec. Devices, vol. ED-15, No. 5, pp. 294–307 (1968).

Darcie et al., "Lightwave Subcarrier CATV Transmission Systems", IEEE Trans. on Microwave Theory and Techniques, vol. 38, No. 5, pp. 524–533 (1990).

Primary Examiner—John S. Heyman
Assistant Examiner—Toan Tran
Attorney, Agent, or Firm—James A. Gabala; Richard A. Kretchmer; Frank J. Sroka

[57] ABSTRACT

A predistortion circuit for cancelling third-order distortion products produced by a non-linear device includes a signal source which drives a first and second circuit branch each including a plurality of series connected diodes having approximately exponential transfer functions. The output signal taken as the summation of the two signals processed by the branch circuits is coupled through an amplifier to the device to be linearized. In an alternate predistortion configuration, the signal source drives a phase splitting means which produces two signals of equal amplitude but opposite phase, wherein each of the signals drives a respective one of the branch circuits. A phase combining means performs an out of-phase combination of the signals processed by the branch circuits.

11 Claims, 7 Drawing Sheets

THIRD-ORDER PREDISTORTION LINEARIZATION CIRCUIT

This is a continuation of application Ser. No. 583,890, filed on Sep. 17, 1990, now abandoned.

FIELD OF THE INVENTION

This invention relates to electronic circuitry and more particularly, to a predistortion linearization circuit which reduces third-order distortion products produced by non-linear electronic or electro-optical devices.

BACKGROUND OF THE INVENTION

Third-order distortion products produced by a nonlinear device limit the dynamic range of analog communication systems. Predistortion linearization is a technique which utilizes an additional nonlinear device to generate distortion products which are equal in amplitude but opposite in phase with the distortion products produced by the device to be linearized.

OBJECTS OF THE INVENTION

It is a principal object of the present invention to construct a non-linear circuit which generates third-order terms for cancelling third-order distortion products produced by non-linear system components.

It is a further object of the present invention to provide a predistortion linearization circuit particularly useful in linearizing an external optical modulator, greatly increasing the dynamic range of an optical communication system using external modulation.

SUMMARY OF THE INVENTION

In one aspect of the present invention a predistortion circuit comprises a first and second circuit branch having a common input and output terminal. The circuit branches each include a plurality of series-connected diodes each having an approximately exponential transfer function. A signal source coupled to the input terminal drives said predistortion circuit, while a first and second bias means provide bias currents to the first and second branches, respectively. An output voltage appears across an impedance means coupling said output terminal to ground.

In a second aspect of the present invention, a predistortion circuit similarly includes a first and second circuit branch having a common input and output terminal. The circuit branches each include a plurality of series-connected diodes each having an approximately exponential transfer function. A phase splitting means provides two split signals having equal amplitudes and opposite phases which are each coupled to a respective branch. A generating means couples an input electrical signal to the phase-splitting means, while a first and second bias means provide bias currents to the first and second branches, respectively. A phase combining means receives the output signals processed by the individual circuit branches and performs an out of-phase combination of said output signals.

DETAILED DESCRIPTION OF THE PREFERRED EMBODIMENTS

Figure 1:
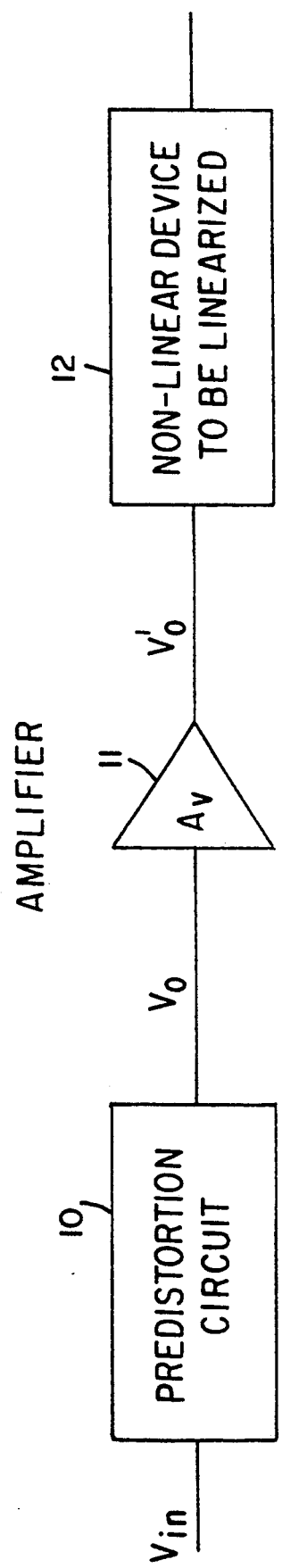
FIG. 1 is a block diagram of a predistortion linearization system.

FIG. 1 illustrates a system for linearizing the transfer functions of a nonlinear device 12 comprising a cascaded arrangement of a predistortion linearization circuit 10, an amplifier 11, and the non-linear device 12 to be linearized. The non-linear device has a transfer function F (to the third-order) of the form:

$$F = C_1 V_o' - C_2 (V_o')^3 \quad (1)$$

where:
F = the non-linear device transfer function,
$V_o'$ = the voltage applied to the non-linear device,
$C_1$ = constant, and $C_2$ = constant.

With appropriate units for $C_1$ and $C_2$, F can describe an output voltage, current, or in the case of an optical modulator, the fraction of incident optical power transmitted to the modulator output port. The predistortion circuit 10 is designed according to the present invention to have a transfer function (to the third order) of the form:

$$V_o = K_1 V_{in} + K_2 (V_{in})^3 \quad (2)$$

where:
$V_o$ = the circuit output voltage,
$V_{in}$ = the circuit input voltage,
$K_1$ = constant (dimensionless), and
$K_2$ = constant (dimension = $V^{-2}$).

The desirability of this particular mathematical expression for the transfer function will become apparent in the discussion below.

If the amplifier has voltage gain $A_v$, the voltage $V_o'$ can be expressed as:

$$V_o' = A_v V_o = A_v (K_1 V_{in} + K_2 V_{in}^3) \quad (3)$$

By substitution of equation (3) into equation (1), it can be seen that the cascaded transfer function for the predistortion circuit, amplifier, and non-linear device becomes:

$$F = C_1 A_v K_1 V_{in} + (C_1 A_v K_2 - C_2 A_v^3 K_1^3) V_{in}^3 \quad (4)$$
+ higher order terms If the amplifier gain is chosen such that:

$$A_v = [C_1 K_2 / C_2 K_1^3]^{\frac{1}{2}} \quad (5),$$

the third-order distortion produced by the non-linear device is cancelled, and equation (4) reduces to $F = C_1 A_v K_1 V_{in}$ wherein F is linearlu related to $V_{in}$. In the general case, a gain $A_v$ of less than one may be desired, allowing an attenuator to be substituted for the amplifier. A transfer function expressed by equation (2)

is a features of the predistortion linearization circuit constructed in accordance with the present invention.

Figure 2:
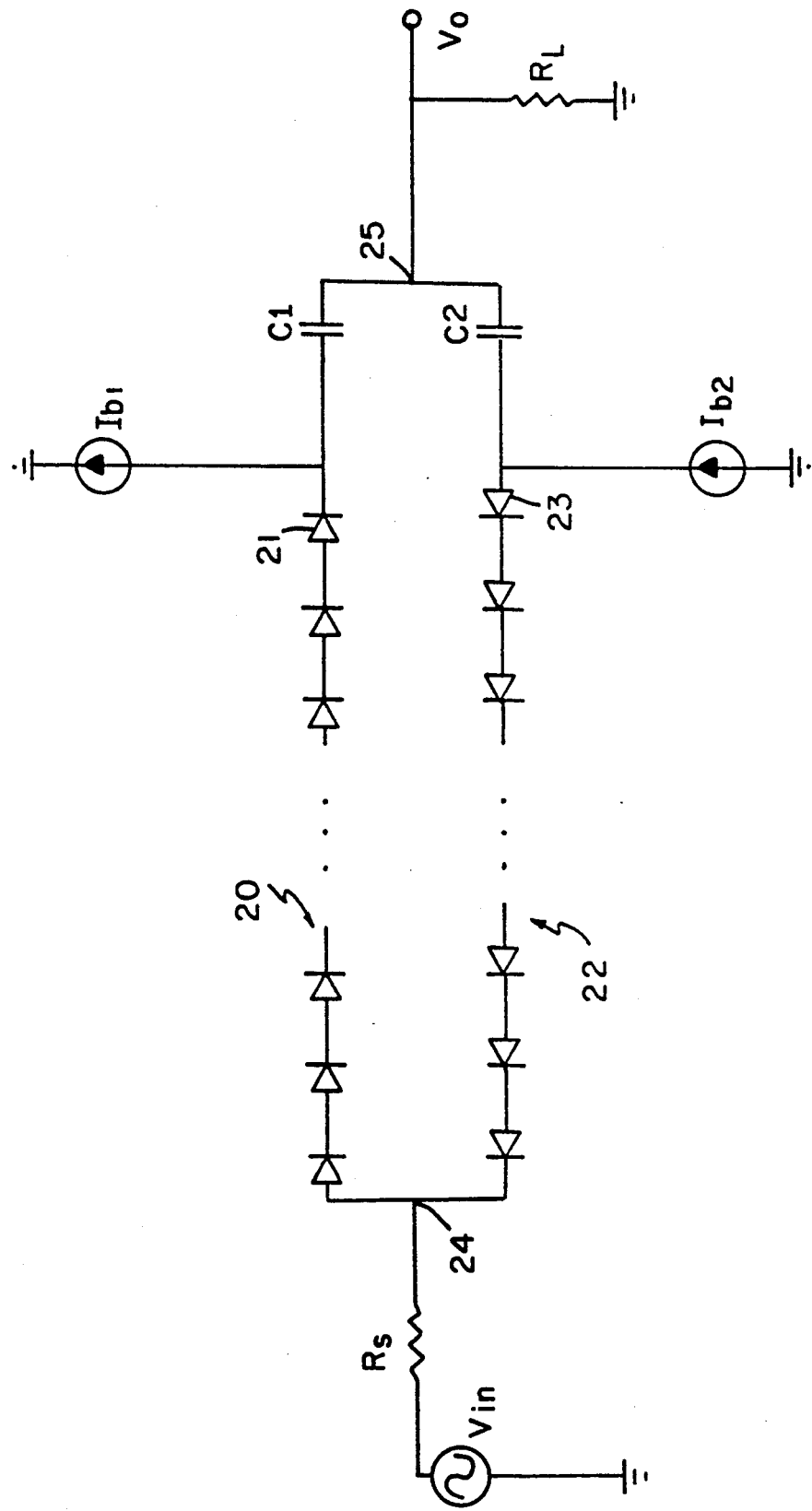
FIG. 2 is a schematic diagram of a predistortion linearization circuit topology in accordance with a first embodiment of the present invention.

FIG. 2 is a circuit schematic diagram of a first embodiment of the present invention. The circuit includes a first circuit branch 20 with a plurality of series-connected diodes 21, and further includes a second circuit branch 22 with a plurality of series-connected diodes 23. As will be explained in more detail below, each diode has an exponential transfer function. The branches have a common input terminal 24 and a common output terminal 25, and are electrically driven by a signal source $V_{in}$ serially coupled through resistor $R_s$ to terminal 24. As shown, the diodes in branch 20 are connected between the terminals 24 and 25 in reverse order to the diodes of the second branch, resulting in a push-pull arrangement of the diodes.

A current source $I_{b1}$ provides a constant bias current to branch 22. A capacitor $C_1$ capacitively couples the anode of diode 21 to the output terminal 25, while capacitor $C_2$ capacitively couples the cathode of diode 23 to terminal 25. The output voltage $V_o$ is taken across a load resistor $R_L$ coupled between terminal 25 and ground.

The symmetry of this circuit due to the push-pull arrangement of diodes cancels the diode generated second order distortion terms, resulting in the generation of primarily third-order distortion products. The circuit can be fabricated with an arbitrary number of series diodes (m) per string. Increasing m will increase the signal amplitude at the network output. The current sources may consist of active circuitry or large resistors which provide a near constant bias current ($I_{b1}$ and $I_{b2}$) to the respective string of series-connected diodes. For matched diodes, $I_{b1}$ and $I_{b2}$ are equal, and will hereinafter be referred to as $I_b$ in any mathematical expression. In general, the ratio of $I_{b1}$ to $I_{b2}$ may be adjusted slightly to reduce any second-order distortion produced by unavoidable asymmetry in either diode characteristics or circuit layout. The coupling capacitors C1 and C2 are chosen to provide a low impedance ($<<R_L$) at all frequencies of interest. The diodes can be either pn-junction or Schottky barrier devices, both of which yield approximately exponential current-voltage characteristics:

$$I = I_o \left[ \exp\left( \frac{V}{nKT/q} - IR_d \right) - 1 \right] \quad (6)$$

where:
$I_o$ = saturation current,
N = diode ideality factor,
K = Boltsman's constant,
T = temperature,
q = charge of electron, and
$R_d$ = diode series resistance.

Figure 3:
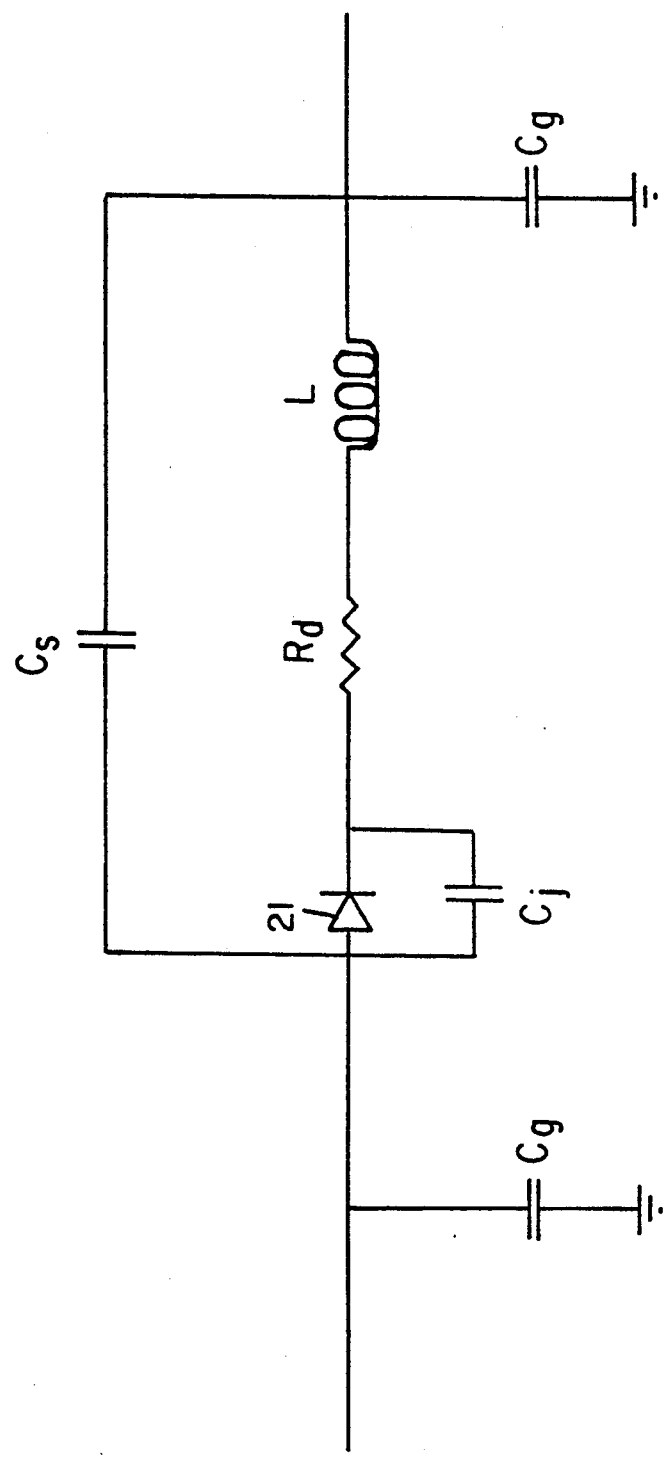
FIG. 3 is a schematic diagram illustrating the circuit representation of each diode in FIG. 2.

Each diode 21 can be represented by the more detailed schematic of FIG. 3, or other similar equivalent circuits which include the effect of parasitic reactances and series resistance. The cathode terminal of diode 21 is coupled to ground through shunt capacitance $C_g$. The diode is connected in parallel with junction capacitance $C_j$ and connected in series with resistance $R_d$ and inductor L wherein this series connection is connected in parallel with stray capacitance $C_s$. The common terminal of capacitor $C_s$ and inductor L is coupled to ground through a second shunt capacitance $C_g$.

Junction capacitance ($C_j$), parasitic lead inductance (L), stray parallel capacitance ($C_s$), and shunt capacitance to ground ($C_g$), will be present to some extent in all physically realizable versions of this circuit. Although these parasitic reactances alter the diode's current-voltage relationship in equation (6) at high frequency, operation of the predistortion circuit described herein has been demonstrated at frequencies in excess of 500 MHz by minimization of these reactances.

The series source impedance ($R_s$) may be comprised of a network of one or more resistors and the output impedance of the signal source $V_{in}$ which drives the predistortion circuit. It is well known that a network of resistances and a signal source with finite output impedance can be represented as a single voltage source with output impedance $R_s$, as shown in FIG. 2. Similarly, the load resistor $R_L$ may be comprised of a network of resistors and the input impedance of an amplifier which follows the predistortion circuit, which can be shown by well known circuit theory to be equivalent to the load resistor $R_L$. Use of a network of resistors allows matching of the predistortion circuit input and output impedance, or for resistive impedance conversion, but does not otherwise alter the operation of the circuit described herein.

The series resistances in the predistortion circuit ($R_s$, $R_L$ and $R_d$) linearize the exponential transfer function of the diodes, which effectively lowers the third-order coefficient ($K_2$) in the circuit transfer function as expressed in the form of equation (1). At low frequency this is of little consequence, since equation (5) can still be satisfied by lowering the amplifier gain. The effect of $R_s$ and $R_L$ can be demonstrated by considering the case of $R_d = 0$, whereby the transfer function of this circuit can be expanded to third-order as:

$$V_o = \left[ \frac{2z}{1 + R_s/R_L} \right] \left[ \frac{1}{(1+2z)} V_{in} + \frac{a^2}{3!(1+2z)^4} V_{in}^3 \right] \quad (7)$$

where:
$z = \alpha[(R_s + R_L)I_b]$,
$\alpha = (nmKT/q)^{-1}$,
$I_b$ = diode bias current, and
m = number of series diodes per string.

It can be seen that the third order coefficient $K_2$ decreases rapidly with the dimensionless variable z, which is linearly proportional to $R_s + R_L$.

Inclusion of $R_d$, the diode series resistance, has been found to have a similar effect on the transfer function to that of $R_s$ and $R_L$. Simulation analysis of the predistortion circuits described herein was performed with the PC-based software package Micro-Cap II manufactured by Spectrum Software of 1021 South Wolfe Road, Sunnyvale, CA 94086. Although mathematical expansion of the resulting transfer function is tedious, circuit simulation using the numerical non-linear circuit model reveals the $R_d$ will also decrease the magnitude of the third-order coefficient. In general, $R_d$ can be comprised of series resistance inherent to the particular diodes employed, or may consist in part of intentionally added external series resistances (or the equivalent lumped resistance) inserted in series with each string of series-connected diodes. In either case the basic operation of the circuit described herein is unaltered.

As previously stated, $R_s$, $R_L$ and $R_d$ reduce the third order coefficient ($K_2$) of this circuit transfer function, which results in a lower required gain ($A_v$) for the amplifier which follows the predistortion circuit. This results in a larger predistortion circuit output voltage ($V_o$), which reduces the signal-to-noise ratio degradation caused by this amplifier. Although this effect is beneficial for low frequency operation, numerical circuit simulation indicates that the third-order distortion reduction which can be obtained at high frequencies is diminished by large values of $R_s$, $R_L$, or $R_d$, for typical values of the diode parasitic reactances $C_g$, $C_j$, $C_s$, and L.

At high frequencies, the diode reactances ($C_g$, $C_j$, $C_s$, and L) give rise to amplitude to phase conversion, which cannot be modeled using Taylor series expansion. Amplitude to phase conversion results in the generation of frequency dependent distortion products, with phase shifts such that these distortion products are no longer opposite in phase with those produced by the device to be linearized. This prevents complete cancellation of the distortion products of the device to be linearized at high frequency. Numerical circuit simulation indicates that amplitude to phase conversion can be minimized by minimizing the diode parasitic reactances ($C_g$, $C_j$, $C_s$, and L), and the series resistances ($R_s$, $R_L$, and $R_d$).

Reduction of the load resistance ($R_L$) of this circuit will decrease the output voltage $V_o$, which will decrease the signal-to-noise ratio after subsequent amplification. However, the output voltage of this network can be increased by increasing the number of series diodes (m) for fixed series resistance ($R_s$, $R_L$, and $R_d$). Numerical simulation indicates that this technique can increase the output voltage into a fixed load resistance, without degradation of the high frequency distortion cancellation characteristics.

To verify operation of the predistortion linearization circuit, a prototype circuit was fabricated using the topology of FIG. 2. The actual circuit, as constructed, is shown in schematic form by FIG. 4, where common numbering between FIGS. 2 and 4 indicates similarity of components or circuits. The diodes 21 and 23 in branches 20 and 22, respectively, are GaAs Schottky barrier ring quads (NEC ND 587R-3C), which allows three series-connected diodes to be used per package. A fourth reverse-biased diode 40 shunts each group of three, thereby raising the effective value of $C_s$ somewhat. However, use of the ring quad package minimizes the series inductance L. The current sources in FIG. 2 are realized with a series connection of either a negative voltage V⁻ or positive voltage V⁺ and a 10 Kohm resistor, providing a constant current of approximately 0.8 mA. The coupling capacitors have a capacitance of 0.1 μF as indicated. The source impedance $R_s$ consists of an external 50 ohm source shunted by the 50 ohm resistor shown. The load impedance $R_L$ consists of an external 50 ohm input impedance amplifier shunted by the 50 ohm resistor shown. This configuration provides an input and output impedance on the order of 40 ohms, which provides an adequate match to a 50 ohm system.

Figure 4:
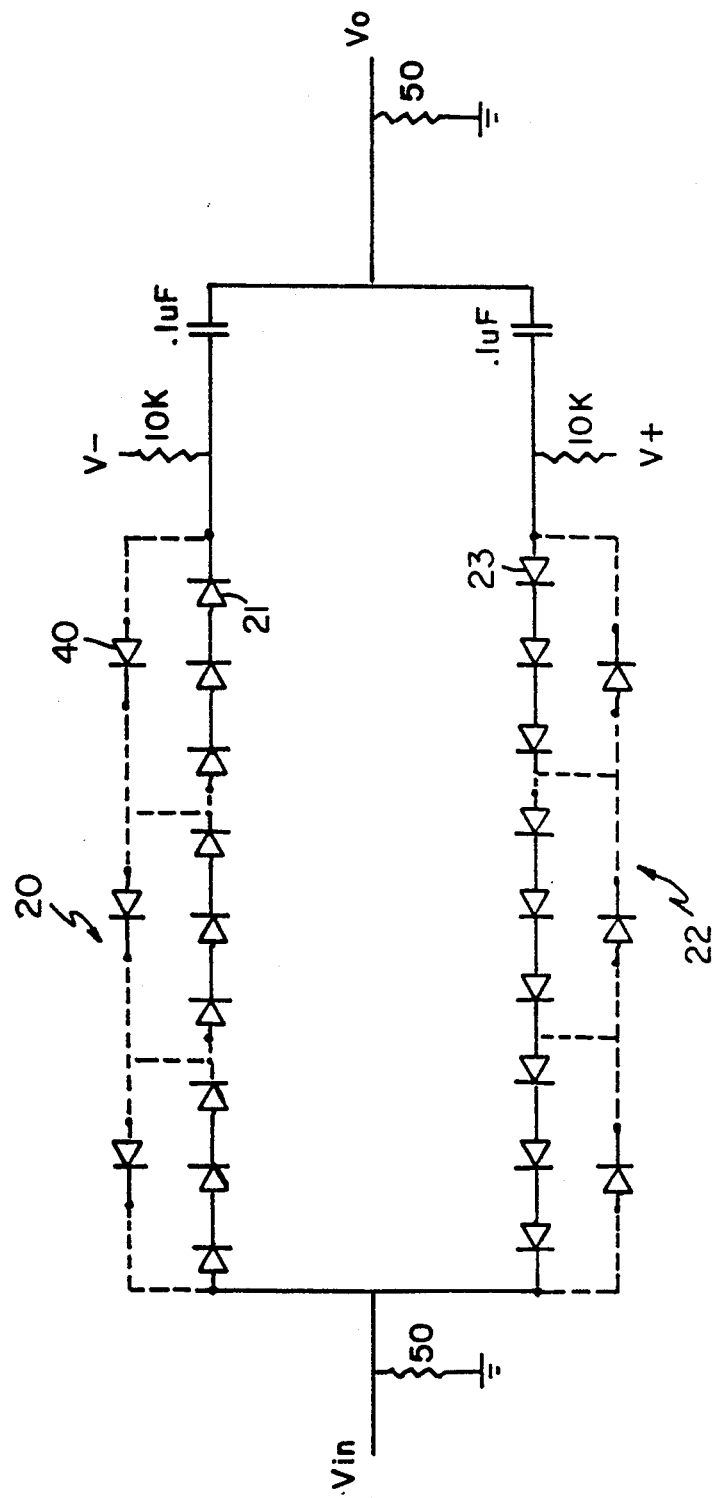
FIG. 4 schematically illustrates the prototype circuit constructed in accordance with the circuit topology of FIG. 2.
Figure 7:
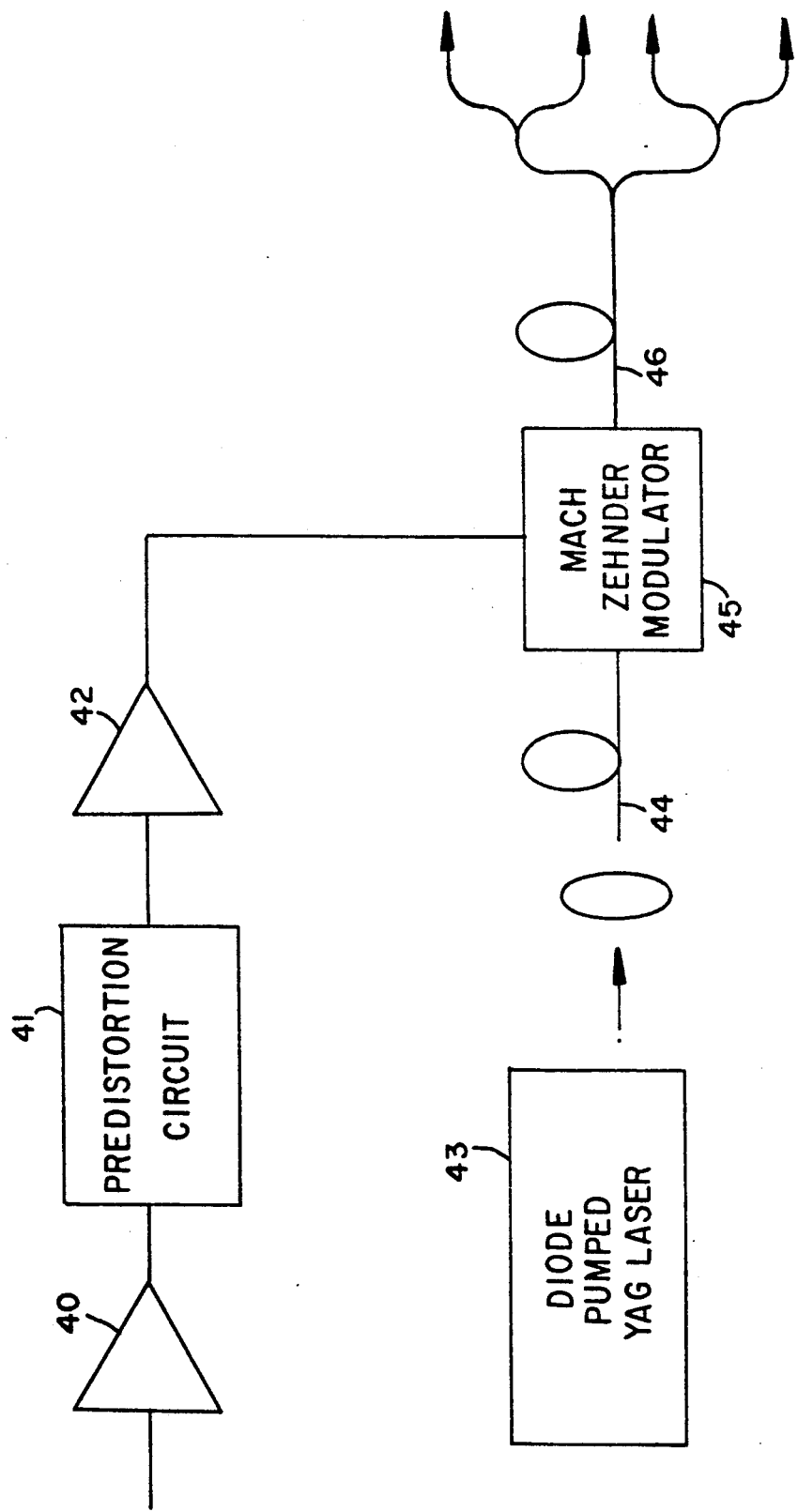
FIG. 7 is an experimental system for characterizing the circuit topology of FIG. 4.

The predistortion circuit of FIG. 4 was characterized using a Mach-Zehnder external optical modulator as the device to be linearized in an experimental demonstration system constructed in accordance with FIG. 7. An amplifier 42 with 34.5 dB gain was required between the predistortion circuit 41 and the modulator 45. A laser source 43 was coupled by fiber 44 into the modulator input port, and the resulting modulated output light appearing on fiber line 46 was photodetected to allow measurement of the distortion products. Third-order distortion was characterized by measuring the Composite Triple Beat (CTB) produced by a CATV signal consisting of 50 video channels located at frequencies varying from approximately 50–425 MHz. At a fixed modulation depth, a reduction in third-order distortion of 14 dB was obtained (measured at 223.25 MHz) using the predistortion circuit. A distinct minimum in third-order distortion could be produced by varying $I_b$, as expected from equation (5) and (7). The Composite Second Order distortion produced by the circuit was also measured. A distinct minimum in second order distortion could be obtained by varying the ratio of $I_{b1}$ and $I_{b2}$.

Figure 5:
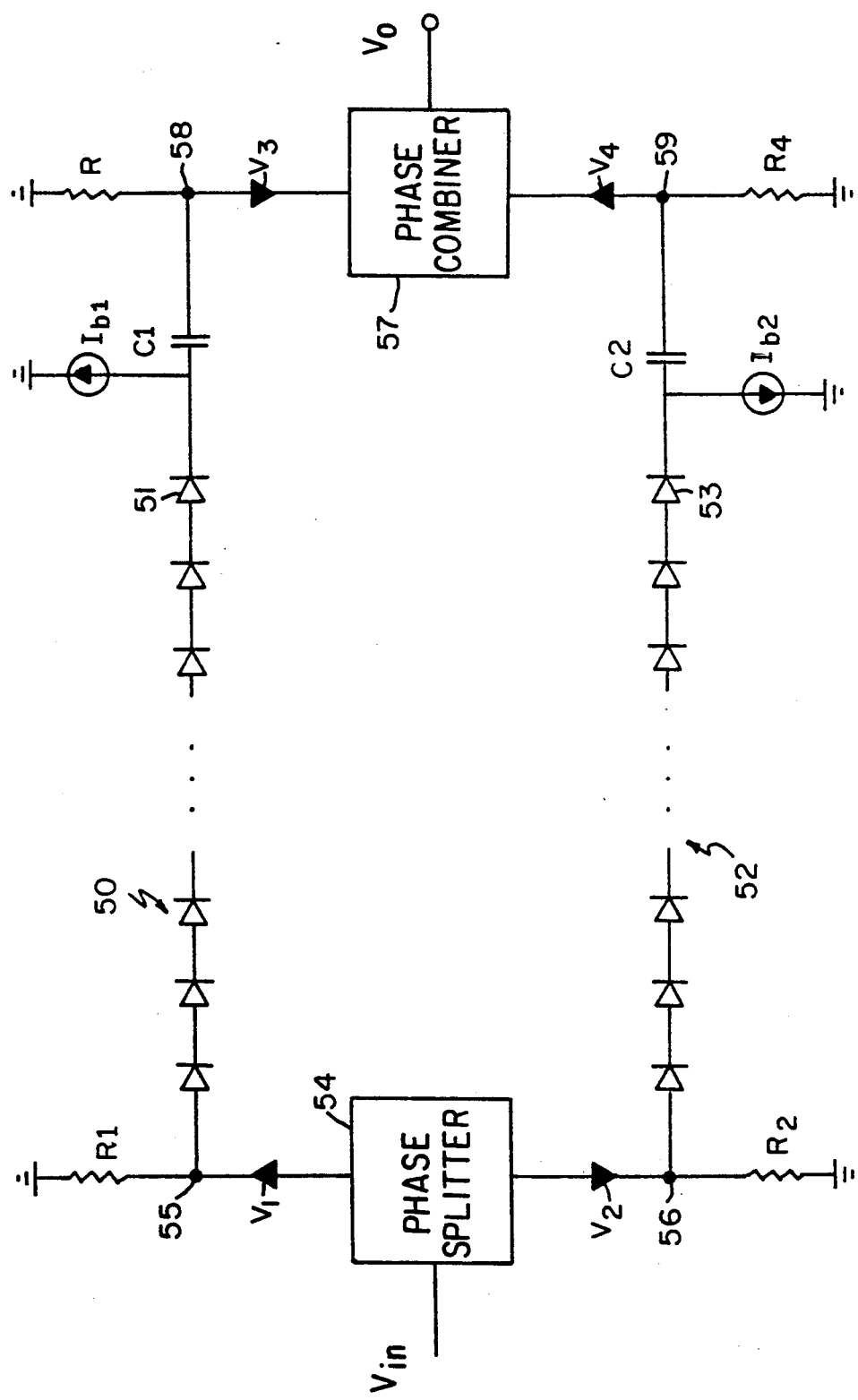
FIG. 5 is a schematic diagram of a predistortion linearization circuit topology in accordance with a second embodiment of the present invention.

FIG. 5 illustrates a circuit schematic diagram in accordance with a second embodiment of the present invention. The circuit includes at an input end a phase splitter 54 which receives an input signal voltage $V_{in}$ and provides output signals $V_1$ and $V_2$ at output ports 55 and 56, respectively, of phase splitter 54. The phase splitter 54 effects a 180° phase shift between the output ports 55 and 56 so that the signals $V_1$ and $V_2$ have equal amplitude but opposite phase. The circuit further includes at an output end a phase combiner 57 having input ports 58 and 59 which receive signals $V_3$ and $V_4$, respectively. The phase combiner 57 is operable in performing an out of-phase combination of signals $V_3$ and $V_4$ whereby one of the signals is phase-shifted 180° relative to the other signal before being combined to produce an output voltage $V_o$.

Between the output port 55 of splitter 54 and the input port 58 of combiner 57 is a first circuit branch 50 including a plurality of series-connected diodes 51. A current source $I_{b1}$ provides a bias current to the diodes of branch 50, with capacitor C1 capacitively coupling the anode of diode 51 to input port 58 of combiner 57. A similar branch circuit 52 is constructed between ports 56 and 59 which likewise includes a plurality of series-connected diodes 53. A current source $I_{b2}$ provides a bias current to the diodes of branch 52, and capacitor C2 couples the anode of diode 52 to input port 59 of combiner 57.

The 180° phase shift between the two output ports of splitter 54 causes the polarity of the diode string connected to one output port of the phase splitting means to be reversed from the polarity of the strings in the circuit of FIG. 2. When the signals $V_3$ and $V_4$ are combined with the out of phase combining means 57 after having been processed by the diodes in the respective branch circuit, this yields a transfer function equivalent to that of the previous circuit in FIG. 2. The phase splitting and out of phase combining means may be reciprocal passive devices such as transformers, baluns, or hybrid junctions. Alternatively, active devices can be used such as an amplifier with complimentary outputs in the case of the phase splitting means, or a differential input amplifier in the case of the out of phase combining means. The details of the phase splitting and out of phase combining means determine the effective values of $R_s$, $R_L$, and $R_d$. As described previously, this alters the magnitude of the third-order coefficient ($K_2$), but not the fundamental operation of this circuit technique.

The alternate topology of FIG. 5 can also be operated without the phase splitting and out of phase combining means. In this case, a balanced source and load voltage are required. Operation of this balanced circuit is otherwise identical to the circuit described herein.

Figure 6:
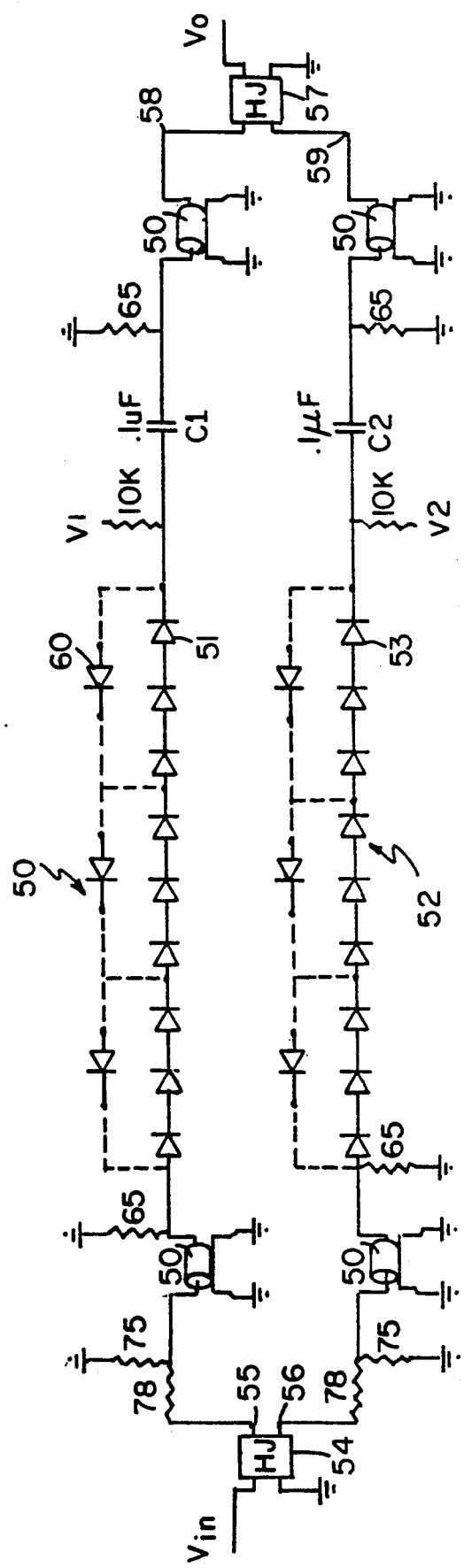
FIG. 6 schematically illustrates the prototype circuit constructed in accordance with the circuit topology of FIG. 5.

The schematic diagram of a predistortion circuit using the alternate topology of FIG. 5 is shown in FIG. 6. Common numbering between FIGS. 5 and 6 indicates similarity of components or circuitry. Hybrid Junctions 54 (Anzac H1-4 50Ω input, 100Ω output) and 57 Anzac H-950Ω were used as both the phase splitting means and the out of phase combining means, respectively. For the phase splitting means 54, a resistive pad was required to match the 100 ohm hybrid junction output to a 50 ohm system. Shunt 65 ohm resistors are used at the input and output of the diode network to match the diodes to 50 ohms. The diodes 51 and 53 in branches 50 and 52, respectively, are GaAs Schottky barrier ring quads (NECND587R-3C), which allows three series-connected diodes to be used per package. A fourth reverse-biased diode 60 shunts each group of three diodes as shown. The measured performance of this circuit was approximately equivalent to the topology of FIG. 2.

While there has been shown and described herein what is considered a preferred embodiment of the present invention, it will be obvious to those skilled in the art that various changes and modifications may be made therein without departing from the invention as defined by the appended claims.

What is claimed is:

1. A predistortion circuit for predistorting an input signal of a nonlinear device to thereby provide a linearized output signal from said nonlinear devices comprising:
    a first circuit branch including a plurality of series-connected diodes each having an approximately exponential transfer function;
    a second circuit branch including a plurality of series-connected diodes each having an approximately exponential transfer function;
    each of said first circuit and said second circuit branches having one end connected to a common input terminal for receiving a signal source to drive said predistortion circuit and having an opposite end for connecting to a common output terminal, wherein the diodes of the first circuit branch are connected between the input terminal and the output terminal in reverse order to the diodes of the second circuit branch;
    first bias means for providing a bias current to said first circuit branch;
    second bias means for providing a bias current to said second circuit branch;
    first capacitance means for capacitively coupling said opposite end of said first circuit branch to said common output terminal;
    second capacitance means for capacitively coupling said opposite end of said second circuit branch to said common output terminal; and
    impedance means for coupling said common output terminal to ground, wherein an output voltage appears across said impedance means.

2. The predistortion circuit as recited in claim 1 further includes
    means for amplifying the output voltage to provide a voltage gain.

3. The predistortion circuit as recited in claim 2 wherein
    said predistortion circuit has a transfer function $V_o$ to the third-order of the form $V_o = K_1 V_{in} + K_2 (V_{in})^3$, wherein $V_o$ is the output voltage of said predistortion circuit, $V_{in}$ is an input voltage produced by said signal source, and $K_1$ and $K_2$ are dimensionless constants; and
    said non-linear device has a transfer function F to the third-order of the form $F = C_1 V_o' - C_2 (V_o')^3$, wherein $C_1$ and $C_2$ are constants and $V_o'$ is an input voltage applied to said non-linear device and is equivalent to the product of $V_o$ and the voltage gain of said amplifying means.

4. The predistortion circuit as recited in claim 1 wherein each of said diodes is a pn-junction device.

5. The predistortion circuit as recited in claim 1 wherein each of said diodes is a Schottky barrier device.

6. A predistortion circuit for predistorting an input signal of a nonlinear device, comprising:
    phase splitting means adapted to receive said input signal and to provide a first split signal at a first output port and a second split signal at a second output port wherein said split signals have equal amplitudes and opposite phases;
    a first circuit branch having an input and output port and including a first string of series-connected diodes each having an approximately exponential transfer function, wherein the input port of said first circuit branch is coupled to the first output port of said phase splitting means for coupling said first split signal to said first string of series-connected diodes;
    a second circuit branch having an input and output port and including a second string of series-connected diodes each having an approximately exponential transfer function, wherein the input port of said second circuit branch is coupled to the second output port of said phase splitting means for coupling said second split signal to said second string of series-connected diodes;
    first bias means for providing a bias current to said first circuit branch;
    second bias means for providing a bias current to said second circuit branch; and
    phase combining means adapted to receive a first output signal coupled from the output port of said first circuit branch and to receive a second output signal coupled from the output port of said second circuit branch for performing an out of-phase combination of said first and second output signals to provide an output signal.

7. The predistortion circuit as recited in claim 6 further includes
    means for amplifying the output signal to provide a voltage gain.

8. The predistortion circuit as recited in claim 7 wherein
    said predistortion circuit has a transfer function $V_o$ to the third-order of the form $V_o = K_1 V_{in} + K_2 (V_{in})^3$, wherein $V_o$ is the output voltage of said predistortion circuit, $V_{in}$ is an input voltage produced by said signal source, and $K_1$ and $K_2$ are dimensionless constants; and
    said non-linear device has a transfer function F to the third-order of the form $F = C_1 V_o' - C_2 (V_o')^3$, wherein $C_1$ and $C_2$ are constants and $V_o'$ is an input voltage applied to said non-linear device and is equivalent to the product of $V_o$ and the voltage gain of said amplifying means.

9. The predistortion circuit as recited in claim 6 wherein each of said diodes is a pn-junction device.

10. The predistortion circuit as recited in claim 6 wherein each of said diodes is a Schottky barrier device.

11. The predistortion circuit as recited in claim 6 further comprises:
    first capacitance means for capacitively coupling said first branch circuit to said common output terminal; and second capacitance means for capacitively coupling said second branch circuit to said common output terminal.

* * * * *